(12) United States Patent
Franck et al.

(10) Patent No.: US 10,659,031 B2
(45) Date of Patent: May 19, 2020

(54) RADIO FREQUENCY SWITCH

(71) Applicant: Qorvo US, Inc., Greensboro, NC (US)

(72) Inventors: Stephen James Franck, Felton, CA (US); Baker Scott, San Jose, CA (US); George Maxim, Saratoga, CA (US); Padmmasini Desikan, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/048,390

(22) Filed: Jul. 30, 2018

(65) Prior Publication Data
US 2020/0036370 A1 Jan. 30, 2020

(51) Int. Cl.
H03K 17/00 (2006.01)
H03K 17/041 (2006.01)

(52) U.S. Cl.
CPC .............. H03K 17/04106 (2013.01)

(58) Field of Classification Search
CPC .......... H03K 17/04106; H03K 17/00
See application file for complete search history.

(56) References Cited

U.S. PATENT DOCUMENTS

| 5,661,414 | A |   | 8/1997  | Shigehara et al. |              |
|-----------|---|---|---------|------------------|--------------|
| 5,689,144 | A |   | 11/1997 | Williams         |              |
| 5,880,620 | A | * | 3/1999  | Gitlin ............ | G11C 5/146   |
|           |   |   |         |                  | 327/534      |
| 5,973,364 | A |   | 10/1999 | Kawanaka         |              |
| 6,191,615 | B1|   | 2/2001  | Koga             |              |
| 8,729,948 | B2|   | 5/2014  | Sugiura          |              |
| 8,829,977 | B2| * | 9/2014  | Jeong ............ | H03K 17/693  |
|           |   |   |         |                  | 327/434      |
| 9,013,225 | B2|   | 4/2015  | Madan et al.     |              |
| 9,048,836 | B2|   | 6/2015  | Maxim et al.     |              |
| 9,628,075 | B2|   | 4/2017  | Cebi et al.      |              |
| 10,044,349| B2|   | 8/2018  | Scott et al.     |              |

(Continued)

FOREIGN PATENT DOCUMENTS

EP    1184977 A2   3/2002
WO    2005117255 A1  12/2005

OTHER PUBLICATIONS

Notice of Allowance for U.S. Appl. No. 15/907,631, dated Dec. 13, 2018, 8 pages.

(Continued)

Primary Examiner — Hai L Nguyen
(74) Attorney, Agent, or Firm — Winthrow & Terranova, P.L.L.C.

(57) ABSTRACT

A radio frequency switch made up of a plurality of switch cells coupled in series between a first node and a second node is disclosed. Each of the plurality of switch cells has a switch field-effect transistor (FET) having a switch drain terminal, a switch source terminal, a switch gate terminal, and a switch body terminal. A body bias network having a first body bias FET with a first drain terminal coupled to the switch body terminal includes a first cross-FET with a second drain terminal coupled to a first source terminal of the first bias body FET and a second source terminal coupled to the switch gate terminal. A second body bias FET has a third drain terminal coupled to the switch body terminal, and a second cross-FET has a fourth drain terminal coupled to a third source terminal of the second body bias FET.

21 Claims, 5 Drawing Sheets

(56) References Cited

U.S. PATENT DOCUMENTS

| | | | |
|---|---|---|---|
| 10,263,616 B1* | 4/2019 | Scott | H03K 17/687 |
| 10,277,222 B1* | 4/2019 | Maxim | H03K 17/161 |
| 2002/0057139 A1 | 5/2002 | Matsumura et al. | |
| 2002/0079544 A1 | 6/2002 | Shino | |
| 2003/0085777 A1 | 5/2003 | Kim et al. | |
| 2005/0195063 A1 | 9/2005 | Mattsson | |
| 2006/0220727 A1 | 10/2006 | Yen | |
| 2007/0018247 A1 | 1/2007 | Brindle et al. | |
| 2008/0237677 A1 | 10/2008 | Futatsugi | |
| 2011/0163824 A1 | 7/2011 | Kawano | |
| 2012/0081192 A1 | 4/2012 | Hanaoka | |
| 2012/0146149 A1 | 6/2012 | Momiyama | |
| 2013/0299890 A1 | 11/2013 | Oh et al. | |
| 2015/0035582 A1 | 2/2015 | Maxim et al. | |
| 2015/0155278 A1 | 6/2015 | Seo et al. | |
| 2015/0341026 A1 | 11/2015 | de Jongh | |

OTHER PUBLICATIONS

Hoppenjans, Eric E. et al., "A Vertically Integrated Tunable UHF Filter," International Microwave Symposium Digest (MTT), May 23-28, 2010, Anaheim, California, IEEE, pp. 1380-1383.

Joshi, H. et al., "Tunable high Q narrow-band triplexer," IEEE MTT-S International Microwave Symposium Digest, Jun. 7-12, 2009, Boston, MA, IEEE, pp. 1477-1480.

Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.

International Search Report and Written Opinion for PCT/US2014/030431, dated Jun. 20, 2014, 14 pages.

Non-Final Office Action for U.S. Appl. No. 14/449,594, dated Oct. 10, 2014, 8 pages.

Notice of Allowance for U.S. Appl. No. 14/449,594, dated Feb. 4, 2015, 6 pages.

Ex Parte Quayle Action for U.S. Appl. No. 15/494,605, mailed Jun. 1, 2018, 5 pages.

Ex Parte Quayle Action for U.S. Appl. No. 15/494,605, mailed Jun. 15, 2018, 5 pages.

Notice of Allowance and Examiner-Initiated Interview Summary for U.S. Appl. No. 15/494,605, dated Sep. 10, 2018, 9 pages.

Non-Final Office Action for U.S. Appl. No. 15/907,631, dated Oct. 22, 2018, 8 pages.

Notice of Allowance for U.S. Appl. No. 15/939,625, dated Nov. 27, 2018, 7 pages.

* cited by examiner

RADIO FREQUENCY SWITCH

FIELD OF THE DISCLOSURE

Embodiments of the present disclosure relate to radio frequency switching circuitry.

BACKGROUND

An important electronic component of a radio frequency (RF) transceiver is a field-effect transistor (FET) that makes up stacked FET-type RF switches. An RF switch that is FET based typically needs linearity compensation to prevent generation of harmonic distortion when transmit signals are applied to the RF switch while the RF switch is in an off-state. The RF switch is effectively open while in the off-state, and the transmit signals are prevented from passing through the RF switch. However, while the RF switch is open, undesirable harmonics are generated from the transmit signals in part due to non-linear capacitance inherent to the RF switch. The undesirable harmonics pass from the RF switch and interfere with the RF transceiver's receiver circuitry.

A traditional off-state linearization network is placed in parallel with the RF switch to reduce the undesirable harmonics. While the traditional off-state linearization network does reduce the harmonic distortion when transmit signals are applied to the RF switch in the off-state, the traditional off-state linearization network takes up valuable circuit real estate because it requires external bias circuitry. Moreover, there is a growing need for RF switches to perform under hot switching conditions in which transmit-level RF signals are present at terminals of the RF switch as the RF switch transitions from the off-state to the on-state and vice versa. What is needed is an RF switch that is structured to regain valuable real estate by way of off-state linearization networks that do not require external bias circuitry and that also switches reliably under hot switching conditions.

SUMMARY

A radio frequency switch having a first node, a second node, and a plurality of switch cells that are coupled in series between the first node and the second node is disclosed. Each of the plurality of switch cells includes a switch field-effect transistor (FET) having a switch drain terminal, a switch source terminal, a switch gate terminal, and a switch body terminal. Further included is a body bias network having a first body bias FET having a first drain terminal coupled to the switch body terminal, a first gate terminal, and a first source terminal. A first cross-FET has a second drain terminal coupled to the first source terminal, a second source terminal coupled to the switch gate terminal, and a second gate terminal.

In at least some exemplary embodiments, each of the plurality of switch cells further includes a second body bias FET that has a third drain terminal coupled to the switch body terminal, a third gate terminal coupled to the second gate terminal, and a third source terminal. This exemplary embodiment also includes a second cross-FET having a fourth drain terminal coupled to the third source terminal, a fourth source terminal coupled to the switch gate terminal, and a fourth gate terminal coupled to the first gate terminal. In some of these exemplary embodiments, each of the plurality of switch cells further includes a first diode stack and a second diode stack that share an anode terminal coupled to the switch body terminal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
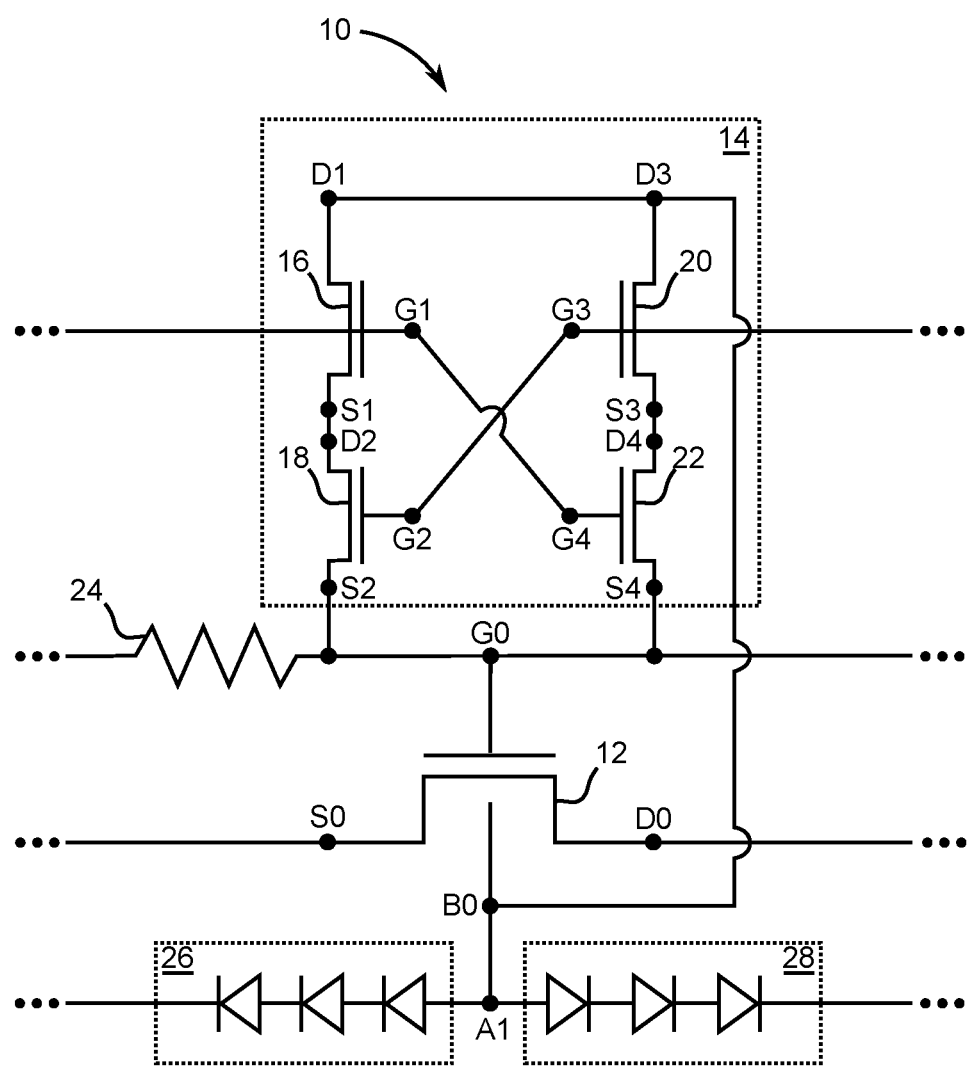
FIG. 1 is a schematic of a switch cell that is structured in accordance with the present disclosure to provide switching of radio frequency (RF) signals.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of a switch cell 10 that is structured in accordance with the present disclosure to provide switching of radio frequency (RF) signals. The switch cell 10 has a switch field-effect transistor (FET) 12 comprising a switch drain terminal D0, a switch source terminal S0, a switch gate terminal G0, and a switch body terminal B0. The switch cell 10 also includes a body bias network 14 that is structured to provide hot switching of RF signals applied across the switch FET 12 while minimizing insertion loss and improving off-state linearity. A benefit of the body bias network 14 is that during operation as the switch FET 12 is transitioned between an off-state to an on-state, the body bias network 14 decouples the switch gate terminal G0 from the switch body terminal B0 to ensure a reliable transition from the off-state to the on-state. Without the series structure of the body bias network 14 disclosed further herein, the switch FET 12 coupled in series with other switch FETs to make up a stacked switch has a problematic tendency in RF to attempt to transition from the off-state to the on-state and then undesirably fall back to the off-state.

In this regard, to solve this problematic tendency, the body bias network 14 includes a first body bias FET 16 having a first drain terminal D1 coupled to the switch body terminal B0, a first gate terminal G1, and a first source terminal S1. A first cross-FET 18 having a second drain terminal D2 coupled to the first source terminal S1, a second source terminal S2 coupled to the switch gate terminal G0, and a second gate terminal G2. A second body bias FET 20 has a third drain terminal D3 coupled to the switch body terminal B0, a third gate terminal G3 coupled to the second gate terminal G2, and a third source terminal S3. A second cross-FET 22 has a fourth drain terminal D4 coupled to the third source terminal S3, a fourth source terminal S4 coupled to the switch gate terminal G0, and a fourth gate terminal G4 coupled to the first gate terminal G1.

Also included in this exemplary embodiment of the switch cell 10 is a gate resistor 24 that helps prevent ringing when the switch FET 12 is switched between an on-state that passes an RF signal between the switch drain terminal D0 and the switch source terminal S0 and an off-state that prevents an RF signal from passing between the switch drain terminal D0 and the switch source terminal S0. In some exemplary embodiments, the gate resistor 24 is a well-type resistor that has a resistance value of 10 kilohm±10%.

Further included are a first diode stack 26 and a second diode stack 28 having a shared anode terminal A1 that is coupled to the switch body terminal B0. In the exemplary embodiment of FIG. 1, the first diode stack 26 and the second diode stack 28 each has three series-coupled diodes that allow current to flow from the switch body terminal B0 to help maintain the switch FET 12 in the off-state during impact ionization events that may occur when the switch FET 12 is already in the off-state. It is to be understood that in some configurations of the switch cell 10 that the number of series-coupled diodes making up the first diode stack 26 and the second diode stack 28 can be a finite number that is more than three diodes and as few as two diodes.

Figure 2:
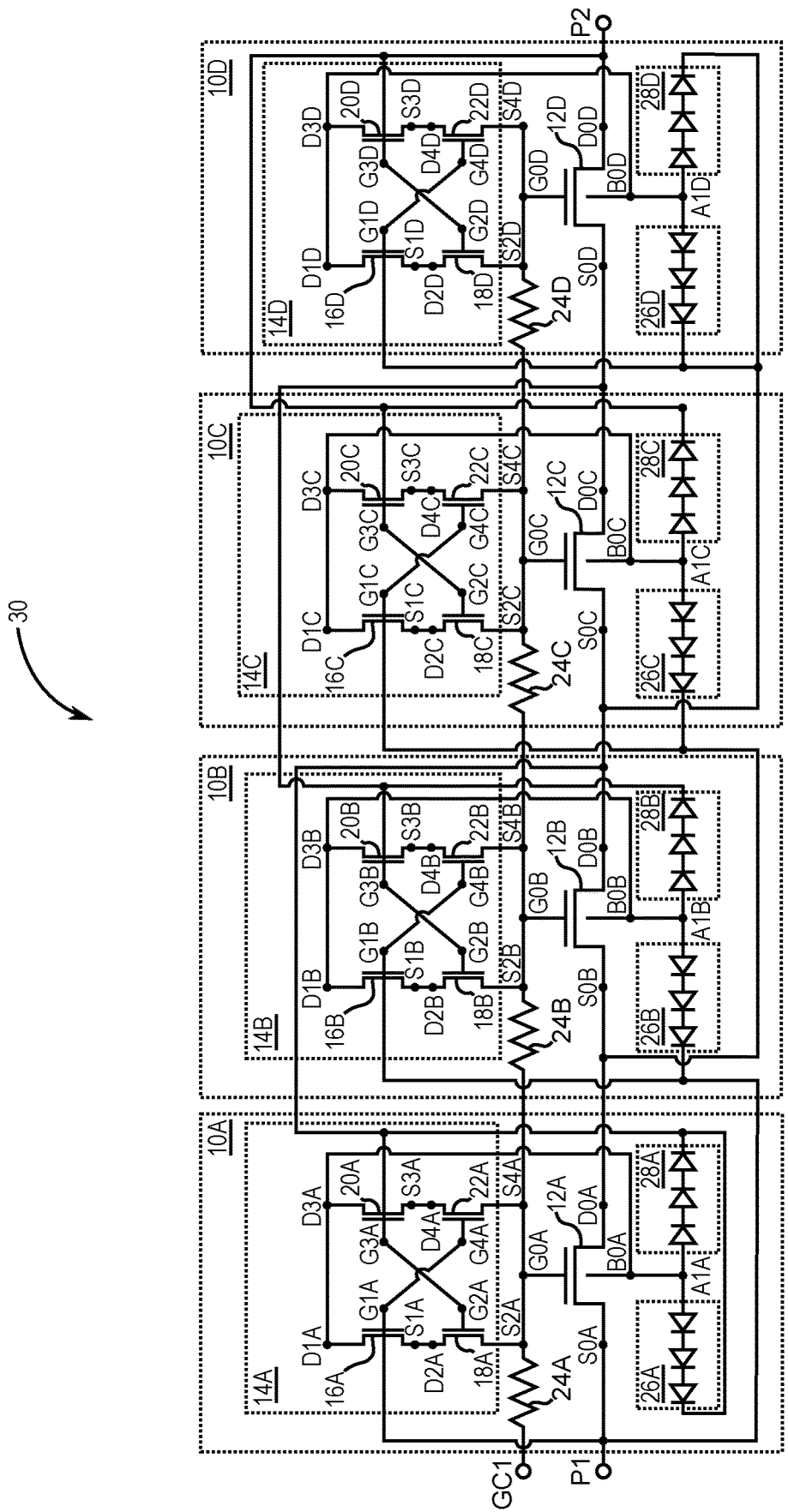
FIG. 2 is a schematic of an exemplary RF switch that is made up of a plurality of the switch cell depicted in FIG. 1.

FIG. 2 is a schematic of an exemplary RF switch 30 that is made up of a plurality of the switch cells 10 depicted in FIG. 1. In the exemplary embodiment of FIG. 2, the RF switch 30 has a first node with a first port terminal P1 that is a first signal port and a second node with a second port terminal P2 that is a second signal port. A plurality of switch cells 10A, 10B, 10C, and 10D is coupled in series between the first port terminal P1 and the second port terminal P2. It is to be understood that the RF switch 30 can have N number of switch cells 10 coupled in series between the first port terminal P1 and the second port terminal P2, wherein N is a finite whole counting number. Thus, while the exemplary embodiment of FIG. 2 is depicted with only four of the switch cells 10, the example is non-limiting. For example, a switch cell 10N can be coupled to a switch cell 10(N−1) in the same manner as the switch cell 10D is coupled to the switch cell 10C.

In the exemplary embodiment of FIG. 2, individual ones of the plurality of switch cells 10A through 10D have switch FETs 12A, 12B, 12C, and 12D, respectively. Each of the switch FETs 12A through 12D has a switch drain terminal D0A, D0B, D0C, and D0D, respectively. The switch FETs 12A through 12D also each have a switch source terminal S0A, S0B, S0C, and S0D, respectively. Moreover, each of the switch FETs 12A through 12D has a switch gate terminal G0A, G0B, G0C, and G0D, respectively.

Each of the switch cells 10A through 10D includes a body bias network 14A, 14B, 14C, and 14D, respectively. Each of the body bias networks 14A through 14D includes a first body bias FET 16A, 16B, 16C, and 16D. Each of the first body bias FETs 16A through 16D has a first drain terminal D1A, D1B, D1C, and D1D, respectively, which is coupled to a corresponding one of the switch body terminals B0A through B0D. Moreover, each of the first body bias FETs 16A through 16D has a first gate terminal G1A, G1B, G1C, and G1D, respectively. Further still, each of the first body bias FETs 16A through 16D has a first source terminal 51A, 51B, 51C, and 51D, respectively.

Each of the body bias networks 14A through 14D also includes a first cross-FET 18A, 18B, 18C, and 18D, respectively. Each of the first cross-FETs 18A through 18D has a second drain terminal D2A, D2B, D2C, and D2D, respectively, which is coupled to a corresponding one of the first source terminals S1A through S1D. Moreover, each of the first cross-FETs 18A through 18D has a second source terminal S2A, 52B, S2C, and S2D, respectively, which is coupled to a corresponding one of the switch gate terminals G0A, G0B, G0C, and G0D. Further still, each of the first cross-FETs 18A through 18D has a second gate terminal G2A, G2B, G2C, and G2D, respectively.

Each of the body bias networks 14A through 14D also includes a second body bias FET 20A, 20B, 20C, and 20D, respectively. Each of the second body bias FETs 20A through 20D has a third drain terminal D3A, D3B, D3C, and D3D, which is coupled to a corresponding one of the switch body terminals B0A, B0B, B0C, and B0D. Moreover, each of the second body bias FETs 20A through 20D has a third gate terminal G3A, G3B, G3C, and G3D, respectively, which is coupled to a corresponding one of the second gate terminal G2A through G2D. Further still, each of the second body bias FETs 20A through 20D has a third source terminal S3A, S3B, S3C, and S3D, respectively.

Each of the body bias networks 14A through 14D also includes a second cross-FET 22A, 22B, 22C, and 22D, respectively. Each of the second cross-FETs 22A through 22D has a fourth drain terminal D4A, D4B, D4C, and D4D, respectively, which is coupled to a corresponding one of the third source terminals S3A through S3D. Moreover, each of the second cross-FETs 22A, through 22D has a fourth source terminal S4A, S4B, S4C, and S4D, respectively, which is coupled to a corresponding one of the switch gate terminals G0A through G0D. Further still, each of the second cross-FETs 22A through 22D has a fourth gate terminal G4A, G4B, G4C, and G4D, respectively. Each of the fourth gate terminals G4A through G4D is coupled to a corresponding one of the first gate terminals G1A through G1D.

Also included in this exemplary embodiment of the switch cells 10A through 10D are gate resistor 24A, 24B, 24C, and 24D that help prevent ringing when the switch FETs 12A through 12D are switched between an on-state that passes an RF signal between the first port terminal P1 and the second port terminal P2 and an off-state that prevents an RF signal from passing between the first port terminal P1 and the second port terminal P2. In some exemplary embodiments, the gate resistors 24A through 24D are well-type resistors that each have a resistance value of 10 kilohm±10%.

Each of switch cells 10A through 10D further includes first diode stacks 26A, 26B, 26C, and 26D and second diode stacks 28A, 28B, 28C, and 28D. The first diode stacks 26A through 26D and the second diode stacks 28A through 28D each have corresponding shared anode terminals A1A, A1B, A1C, and A1D that are coupled to a corresponding one of the switch body terminals B0A through B0D.

The switch cell 10A is coupled to the first node by way of the first switch source terminal S0A being coupled to the first port terminal P1, which in turn is coupled to both the first gate terminal G1A of the first body bias FET 16A and the fourth gate terminal G4A of the second cross FET 22A. The gate resistor 24A is coupled to a gate control terminal GC1 to which an on/off signal is applied to control the on-state and the off-state of the RF switch 30. A cathode of the first diode stack 26A is coupled to a cathode of the second diode stack 28A, which in turn is coupled to both the third gate terminal G3A of the second body bias FET 20A and the second gate terminal G2A of the first cross-FET 18A.

The switch cell 10B is coupled to the switch cell 10A by way of the following first set of couplings. The switch source terminal S0B of the switch FET 12B is coupled to the switch drain terminal D0A of the switch FET 12A. The switch gate terminal G0B of the switch FET 12B is coupled through the gate resistor 24B to the switch gate terminal G0A of the switch FET 12A. The third gate terminal G3A of the second body bias FET 20A is coupled to the switch drain terminal D0B of the switch FET 12B. The cathode of the first diode stack 26B is coupled to the switch source terminal S0A of the switch cell 10A and to the first node at the first port terminal P1, which is also coupled to the first gate terminal G1B of the first body bias FET 16B of the switch cell 10B.

The switch cell 10C is coupled to the switch cell 10B by way of the following second set of couplings. The switch source terminal S0C of the switch FET 12C is coupled to the switch drain terminal D0B of the switch FET 12B. The switch gate terminal G0C of the switch FET 12C is coupled through the gate resistor 24C to the switch gate terminal G0B of the switch FET 12B. The second gate terminal G2B of the first cross-FET 18B and the third gate terminal G3B of the second body bias FET 20B are coupled to the switch drain terminal D0C of the switch FET 12C. The cathode of the first diode stack 26C is coupled to both the first gate terminal G1C of the first body bias FET 16C and the switch source terminal S0B of the switch FET 12B of the switch cell 10B.

The switch cell 10D is coupled to the switch cell 10C by way of the following third set of couplings. The switch source terminal S0D of the switch FET 12D is coupled to the switch drain terminal D0C of the switch FET 12C. The switch gate terminal G0D of the switch FET 12D is coupled through the gate resistor 24D to the switch gate terminal G0C of the switch FET 12C. The third gate terminal G3C of the second body bias FET 20C is coupled to both the third gate terminal G3D of the second bias FET 20D and the switch drain terminal D0D of the switch FET 12D, which are both coupled to second node at the second port terminal P2. The cathodes of both the first diode stack 26D and the second diode stack 28C are coupled to both the first gate terminal G1D of the first body bias FET 16D and to the switch source terminal S0C of the switch FET 12C.

Figure 3:
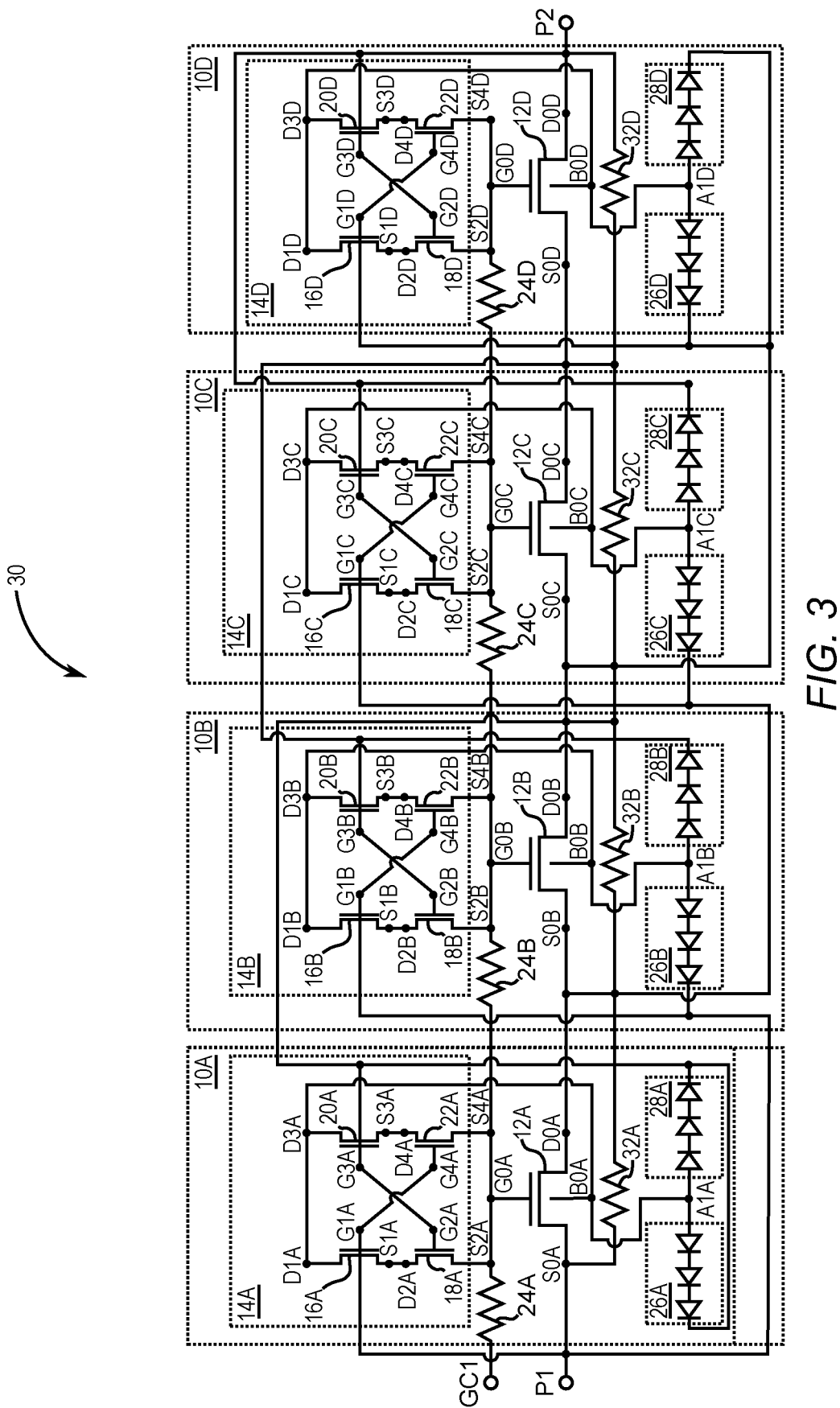
FIG. 3 is a schematic of the exemplary RF switch of FIG. 2 that includes drain-to-source resistors to ease voltage stress on field-effect transistors (FETs) making up a body bias network of each switch cell.

FIG. 3 is a schematic of the exemplary RF switch 30 of FIG. 2 that includes a plurality of drain-to-source resistors 32A, 32B, 32C, and 32D to ease voltage stress on the first body bias FETs 16A through 16D and the second body bias FETs 20A through 20D. Each of the drain-to-source resistors 32A through 32D is coupled across a corresponding one of the switch FETs 12A through 12D.

Figure 4:
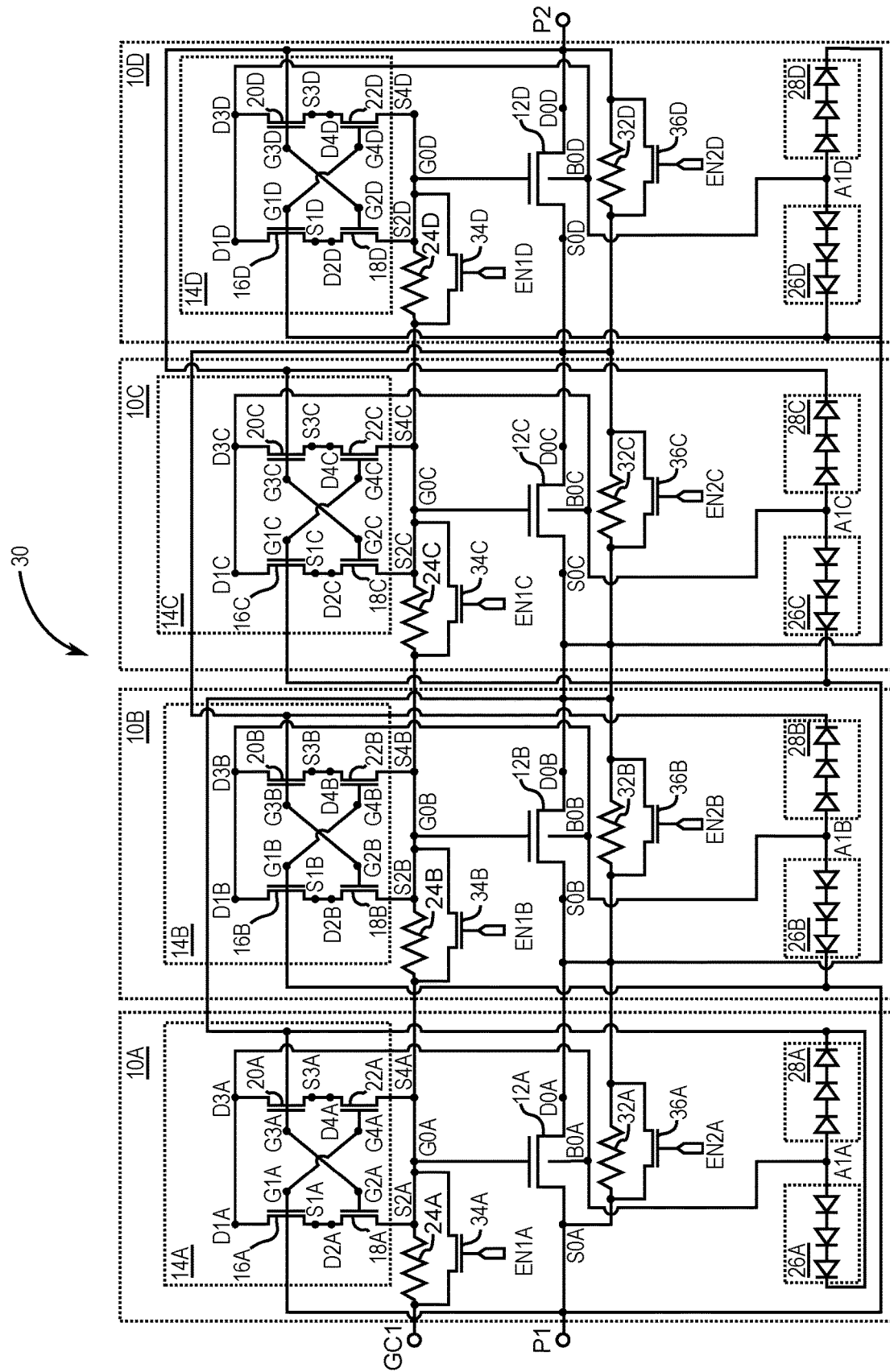
FIG. 4 is a schematic of the exemplary RF switch of FIG. 2 that includes a plurality of first acceleration FETs and a plurality of second acceleration FETs for speeding up switching transitions between the off-state and the on-state of the RF switch.

FIG. 4 is a schematic of the exemplary RF switch 30 of FIG. 2 that includes a plurality of first acceleration FETs 34A, 34B, 34C, and 34D. Each of the plurality of the first acceleration FETs 34A through 34D is coupled across a corresponding one of the gate resistors 24A through 24D. Each of the first plurality of first acceleration switches 34A through 34D has a corresponding enable terminal EN1A, EN1B, EN1C, and EN1D. A first enable signal is applied to the enable terminals EN1A through EN1D to turn on each of the first plurality of first acceleration switches 34A through 34D to short the gate resistors 24A through 24D during a transition period from the off-state to the on-state of the RF switch 30.

The exemplary embodiment of the RF switch 30 depicted in FIG. 4 also includes a plurality of second acceleration FETs 36A, 36B, 36C, and 36D. Each of the plurality of the second acceleration FETs 36A through 36D is coupled across a corresponding one of the drain-to-source resistors 32A through 32D. A second enable signal is applied to a corresponding enable terminal EN2A, EN2B, EN2C, and EN2D, respectively, to turn on each of the second plurality of first acceleration switches 36A through 36D to short the drain-to-source resistors 32A through 32D during the transition period from the off-state to the on-state of the RF switch 30. The first enable signal and the second enable signal may be derived from a gate control signal applied to the gate control terminal GC1. Alternatively, the first enable signal and the second enable signal may be generated by an external processor. In some embodiments the first enable signal and the second enable signal may be the same signal.

Figure 5:
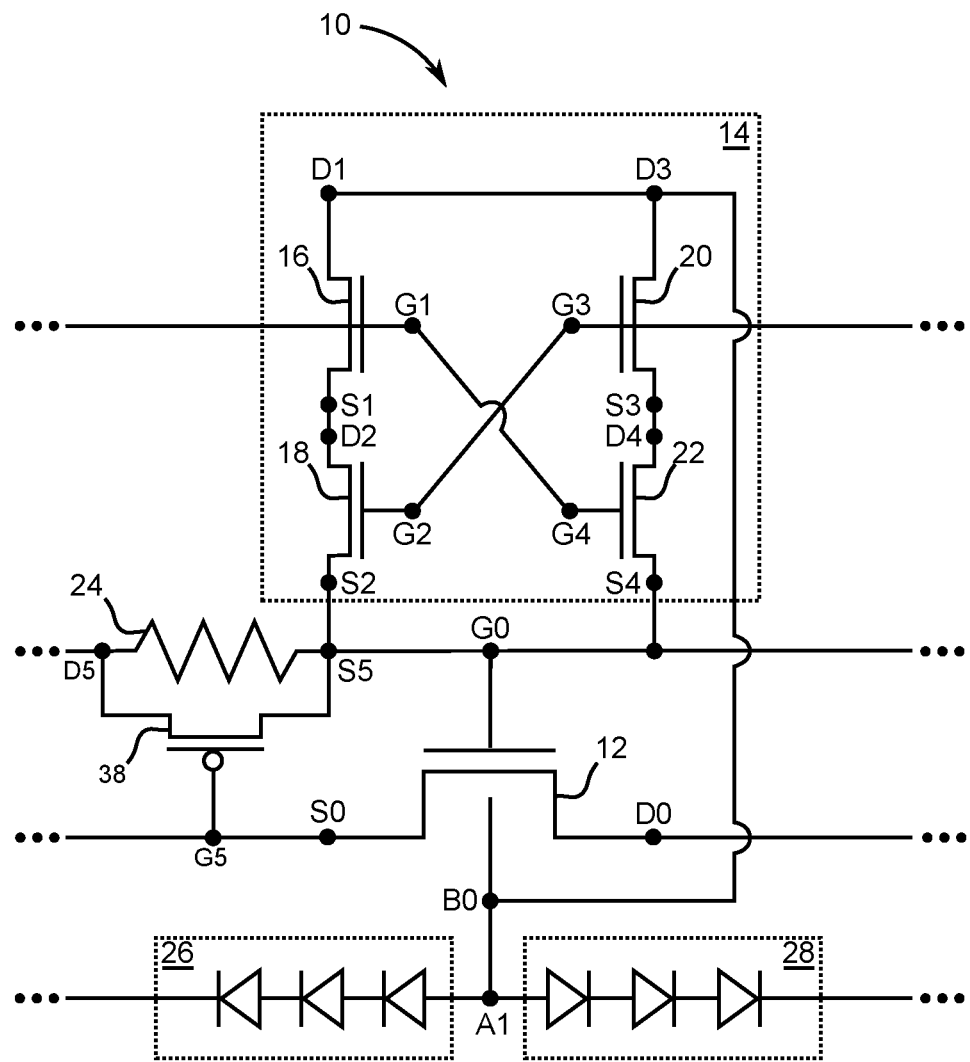
FIG. 5 is a schematic of an exemplary embodiment of the switch cell that is structured in accordance with the present disclosure to provide accelerated switching of RF signals by incorporating a pFET to short a gate resistor.

FIG. 5 is a schematic of an exemplary embodiment of the switch cell that is structured in accordance with the present disclosure to provide accelerated switching of RF signals by incorporating an acceleration FET 38 to short the gate resistor 24. In this exemplary embodiment, the switch FET 12 is of the negative-metal-oxide-semiconductor (NMOS) type and the acceleration FET 38 is of the positive-MOS (PMOS) type. A source S5 and a drain D5 of the acceleration FET 38 are coupled to opposite ends of the gate resistor 24, and a gate G5 of the acceleration FET 38 is coupled to the source S0 of the switch FET 12. In this configuration, an equal and opposite gate-to-source voltage is achieved to cause the acceleration FET 38 to turn on and short the gate resistor 24 when the switch FET 12 is in the on-state. Moreover, when the switch FET 12 is in the off-state, the acceleration FET 38 is also in the off-state. The acceleration FET 38 is typically at least an order of magnitude smaller than the switch FET 12.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency switch comprising a first node, a second node, and a plurality of switch cells that is coupled in series between the first node and the second node, wherein each of the plurality of switch cells comprises:
   a switch field-effect transistor (FET) comprising a switch drain terminal, a switch source terminal, a switch gate terminal, and a switch body terminal; and
   a body bias network comprising:
      a first body bias FET having a first drain terminal coupled to the switch body terminal, a first gate terminal, and a first source terminal;
      a first cross-FET having a second drain terminal coupled to the first source terminal, a second source terminal coupled to the switch gate terminal, and a second gate terminal;
      a second body bias FET having a third drain terminal coupled to the switch body terminal, a third gate terminal, and a third source terminal; and
      a second cross-FET having a fourth drain terminal coupled to the third source terminal, a fourth source terminal coupled to the switch gate terminal, and a fourth gate terminal, wherein the first gate terminal of the first body bias FET is coupled to the fourth gate terminal of the second cross-FET, and the third gate terminal of the second body bias FET is coupled to the second gate terminal of the first cross-FET.

2. The radio frequency switch of claim 1 further comprising:
   a first adjacent switch FET through which the second gate terminal of the first cross-FET is coupled to the switch drain terminal of the switch FET; and
   a second adjacent switch FET through which the fourth gate terminal of the second cross-FET is coupled to the switch source terminal of the switch FET.

3. The radio frequency switch of claim 1 wherein the second gate terminal of the first cross-FET is coupled to the switch body terminal of the switch FET, and the fourth gate terminal of the second cross-FET is coupled to the switch body terminal of the switch FET.

4. The radio frequency switch of claim 1 wherein each of the plurality of switch cells includes a gate resistor coupled to the switch gate terminal of the switch FET.

5. The radio frequency switch of claim 4 wherein each of the plurality of switch cells includes an acceleration FET coupled across the gate resistor to short the gate resistor as the radio frequency switch transitions from an off-state to an on-state.

6. The radio frequency switch of claim 1 wherein each of the plurality of switch cells includes a drain-to-source resistor coupled across the switch FET from switch drain terminal to switch source terminal.

7. The radio frequency switch of claim 6 wherein each of the plurality of switch cells includes an acceleration FET coupled across the drain-to-source resistor to short the drain-to-source resistor as the radio frequency switch transitions from an off-state to an on-state.

8. The radio frequency switch of claim 1 wherein each of the plurality of switch cells includes a gate resistor coupled to the switch gate terminal of the switch FET and further includes a drain-to-source resistor coupled across the switch FET from switch drain terminal to switch source terminal.

9. The radio frequency switch of claim 8 wherein each of the plurality of switch cells includes a first acceleration FET coupled across the gate resistor to short the gate resistor as the radio frequency switch transitions from an off-state to an on-state and a second acceleration FET coupled across the drain-to-source resistor to short the gate resistor as the radio frequency switch transitions from an off-state to an on-state.

10. The radio frequency switch of claim 1 further comprising a first diode stack and a second diode stack having a shared anode terminal that is coupled to the switch body terminal.

11. The radio frequency switch of claim 10 wherein a cathode of the second diode stack is coupled to the second gate terminal of the first cross-FET.

12. A radio frequency switch comprising a first node, a second node, and a plurality of switch cells that is coupled in series between the first node and the second node, wherein each of the plurality of switch cells comprises:
   a switch field-effect transistor (FET) comprising a switch drain terminal, a switch source terminal, a switch gate terminal, and a switch body terminal; and
   a body bias network comprising:
      a first body bias FET having a first drain terminal coupled to the switch body terminal, a first gate terminal, and a first source terminal;
      a first cross-FET having a second drain terminal coupled to the first source terminal, a second source terminal coupled to the switch gate terminal, and a second gate terminal;
      a second body bias FET having a third drain terminal coupled to the switch body terminal, a third gate terminal, and a third source terminal;
      a second cross-FET having a fourth drain terminal coupled to the third source terminal, a fourth source terminal coupled to the switch gate terminal, and a fourth gate terminal, wherein the first gate terminal of the first body bias FET is coupled to the fourth gate terminal of the second cross-FET, and the third gate terminal of the second body bias FET is coupled to the second gate terminal of the first cross-FET; and a first adjacent switch FET through which the second gate terminal of the first cross-FET is coupled to the switch drain terminal of the switch FET; and a second adjacent switch FET through which the fourth gate terminal of the second cross-FET is coupled to the switch source terminal of the switch FET.

13. The radio frequency switch of claim 12 wherein the second gate terminal of the first cross-FET is coupled to the switch body terminal of the switch FET, and the fourth gate terminal of the second cross-FET is coupled to the switch body terminal of the switch FET.

14. The radio frequency switch of claim 12 wherein each of the plurality of switch cells includes a gate resistor coupled to the switch gate terminal of the switch FET.

15. The radio frequency switch of claim 14 wherein each of the plurality of switch cells includes an acceleration FET coupled across the gate resistor to short the gate resistor as the radio frequency switch transitions from an off-state to an on-state.

16. The radio frequency switch of claim 12 wherein each of the plurality of switch cells includes a drain-to-source resistor coupled across the switch FET from switch drain terminal to switch source terminal.

17. The radio frequency switch of claim 16 wherein each of the plurality of switch cells includes an acceleration FET coupled across the drain-to-source resistor to short the drain-to-source resistor as the radio frequency switch transitions from an off-state to an on-state.

18. The radio frequency switch of claim 12 wherein the third gate terminal of the second body bias FET of one of the plurality of switch cells is coupled to the switch drain terminal of the switch FET of an adjacent one of the plurality of switch cells.

19. The radio frequency switch of claim 12 further comprising a first diode stack with a first cathode and a second diode stack with a second cathode having a shared anode terminal that is coupled to the switch body terminal of the switch FET.

20. The radio frequency switch of claim 19 wherein the second cathode of the second diode stack is coupled to the second gate terminal of the first cross-FET.

21. The radio frequency switch of claim 20 wherein the switch source terminal of a first one of the plurality of switch cells is coupled to the first node and the first cathode of the first diode stack is coupled to the second cathode of the second diode stack.

* * * * *

UNITED STATES PATENT AND TRADEMARK OFFICE
CERTIFICATE OF CORRECTION

PATENT NO. : 10,659,031 B2
APPLICATION NO. : 16/048390
DATED : May 19, 2020
INVENTOR(S) : Stephen James Franck et al.

Page 1 of 1

It is certified that error appears in the above-identified patent and that said Letters Patent is hereby corrected as shown below:

In the Specification

Column 3, Lines 42, 50, 60, and 66, replace "BO" with --B0--.
Column 4, Lines 16 and 19, replace "BO" with --B0--.
Column 4, Line 48, replace "DOA, DOB, DOC, and DOD" with --D0A, D0B, D0C, and D0D--.
Column 4, Line 50, replace "SOB, SOC, and SOD" with --S0B, S0C, and S0D--.
Column 4, Lines 63-64, replace "51A, 51B, 51C, and 51D" with --S1A, S1B, S1C, and S1D--.
Column 5, Line 3, replace "source terminals 51A through 51D" with --source terminals S1A through S1D--.
Column 5, Line 5, replace "52B" with --S2B--.
Column 6, Line 2, replace "DOA" with --D0A--.
Column 6, Lines 7 and 15, replace "DOB" with --D0B--.
Column 6, Lines 21 and 29, replace "DOC" with --D0C--.
Column 6, Line 35, replace "DOD" with --D0D--.

Signed and Sealed this
Thirtieth Day of June, 2020

Andrei Iancu
*Director of the United States Patent and Trademark Office*